United States Patent [19]

Sullivan et al.

[11] Patent Number: 5,402,367
[45] Date of Patent: Mar. 28, 1995

[54] APPARATUS AND METHOD FOR MODEL BASED PROCESS CONTROL

[75] Inventors: Michael F. Sullivan, Dallas; Judith S. Hirsch, Plano; Stephanie W. Butler, Plano; Nicholas J. Tovell, Plano; Jerry A. Stefani, Richardson; Purnendu K. Mozumder; Ulrich H. Wild, both of Dallas; Chun-Jen J. Wang, Richardson, all of Tex.; Robert A. Hartzell, Sacramento, Calif.

[73] Assignee: Texas Instruments, Incorporated, Dallas, Tex.

[21] Appl. No.: 93,842

[22] Filed: Jul. 19, 1993

[51] Int. Cl.⁶ .............................................. G05B 13/04
[52] U.S. Cl. .................. 364/578; 364/464.01; 364/551.01; 364/570
[58] Field of Search ............... 364/578, 501, 494, 151, 364/156, 468, 158, 153, 149, 150, 151

[56] References Cited

U.S. PATENT DOCUMENTS

| | | | |
|---|---|---|---|
| 3,686,488 | 8/1972 | Woodle | 364/153 |
| 4,577,280 | 3/1986 | Putman | 364/494 |
| 4,604,714 | 8/1986 | Putman et al. | 364/494 |
| 4,622,633 | 11/1986 | Ceccon et al. | 364/200 |
| 4,628,462 | 12/1986 | Putman | 364/151 |
| 4,736,324 | 4/1988 | Sainen et al. | 364/470 |
| 4,796,194 | 1/1989 | Atherton | 364/468 |
| 4,831,582 | 5/1989 | Miller et al. | 364/900 |
| 4,888,692 | 12/1989 | Gupta et al. | 364/402 |
| 4,926,753 | 5/1992 | Weiss | 104/88 |
| 5,014,208 | 5/1991 | Wolfson | 364/468 |
| 5,060,132 | 10/1991 | Beller et al. | 364/158 |
| 5,132,918 | 7/1992 | Fnk | 364/501 |
| 5,153,807 | 10/1992 | Saito et al. | 364/158 |
| 5,157,613 | 10/1992 | Williams et al. | 364/158 |
| 5,260,865 | 11/1993 | Beauford et al. | 364/501 |
| 5,301,101 | 4/1994 | MacArthur et al. | 364/156 |
| 5,305,221 | 4/1994 | Atherton | 364/468 |

Primary Examiner—Emanuel T. Voeltz
Assistant Examiner—Alan H. Tran
Attorney, Agent, or Firm—W. Daniel Swayze, Jr.; Leo N. Heiting; Richard L. Donaldson

[57] ABSTRACT

The present invention configures a control strategy and a process model to calculate a setting of a machine. The present invention adjusts the process model in accordance with an analysis of the setting to control the machine.

19 Claims, 3 Drawing Sheets

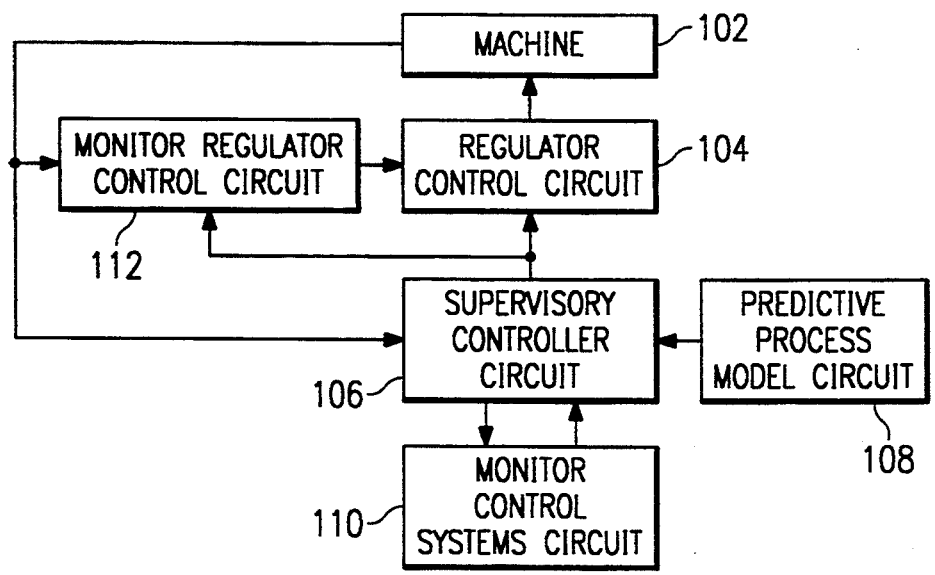
FIG. 1
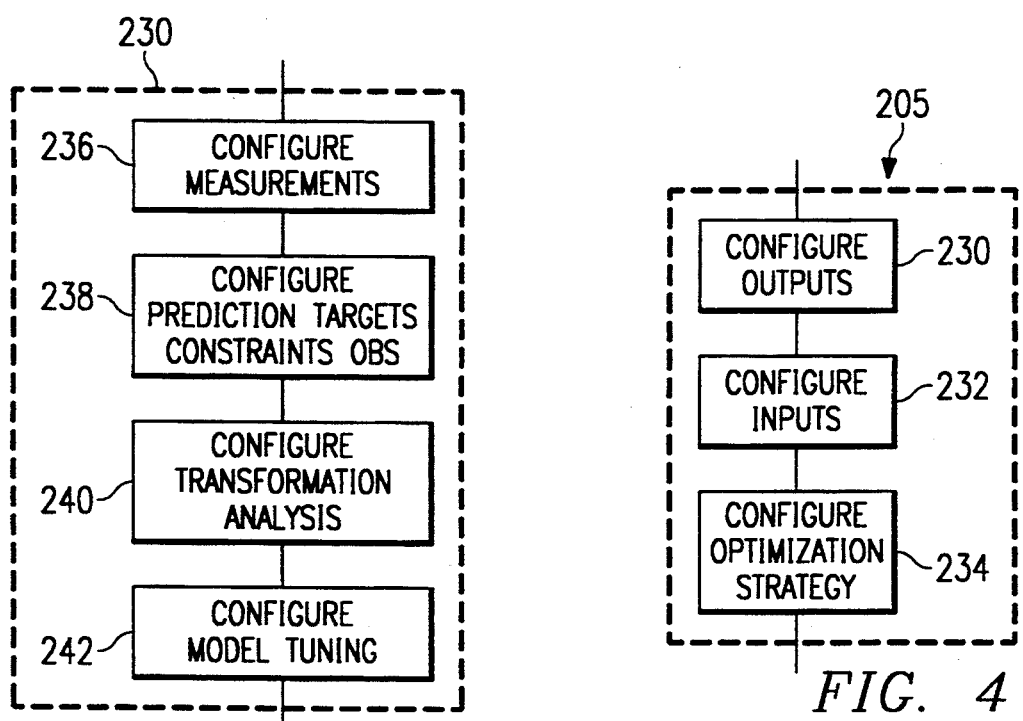
FIG. 3
FIG. 4

APPARATUS AND METHOD FOR MODEL BASED PROCESS CONTROL

FIELD OF THE INVENTION

This invention relates to a process for the modeling and control of equipment processed in factories which have fabrication and other techniques. The invention further relates to a computer integrated manufacturing (CIM) system that includes a factory-specific model for automatic control and to the use of the models for the design of the CIM systems.

BACKGROUND OF THE INVENTION

Most manufacturing plants or factories are distributed in that they consist of heterogenous, unconnected factory stations to do work. The virtue of this factory design is that it provides the adaptability to a varying product mix. The drawback is the resulting complexity of operations, management, and quality control.

A distributed manufacturing plant is capable of fabricating a variety of products through an ordered-process sequence of process steps. Each process step can be performed by at least one station in the factory. Distributed factories are common in the manufacture of modern electronic products. Six types of distributed factories can be involved: wafer slicing, wafer fabrication, semiconductor-component assembly, circuit-board fabrication, circuit-board assembly, electric-product assembly. The arch type of the distributed factory is a wafer-fabrication plant or "wafer fab," which may manufacture products simultaneously according to over 1000 processes, averaging over 100 steps each.

The wafer fabrication factories with over 1000 fabrication sequences are known. Such a collection of processes is difficult to represent in a drawing like a fab graph. Such a factory, however, can be described to a computer system.

The complexity of distributed factories is further illustrated by the existence of tens of thousands of fabrication sequences in a general class of distributed factory called a "job shop." The standard approach to describing the collection of sequences in the job shop is to surrender to the complexity and describe the product class through the factory as being random. These are clearly not random, but only recently have computers provided the practical computational power to describe highly complex factories accurately.

The factory is a complex, data and information rich entity. The data structure with tens of thousands of parameters may be required merely to describe the factory. Furthermore, in operation, a dynamic factory produces orders of magnitude of data describing the production flows. The sheer volume of information has made the operation and control of distributed factories a major problem.

Despite the large data volumes and complexity of the problem, factory management and control was accomplished primarily by manual methods with limited assistance in scheduling from software. The software schedule in practice is determined by the decisions of various production supervisors or foreman, or in some cases the workers themselves. In attempts to address the problems of optimal factory control, a tremendous theoretical literature on production scheduling has been developed. The result of this work has been to establish that current factory control is far from optimal and to define the degree of complexity of the factory management issues. Unfortunately, this work has not resulted in practical methods for factory control. On the other hand, the world is filled with real factories that operate, however, sub-optimally. Where the theory has provided solutions to control, factories run through thousands of ad-hoc decisions made on the factory floor. Thus, there exists a substantial need for the improvement in modeling and control techniques so that they can be of more practical use. Each factory's equipment generally has it own control systems and monitoring capabilities for monitoring the flow, pressure, and adjustments for maintaining a given setpoint. As these machines become more sophisticated and capable of computer control, the control of these machines is increasingly being controlled through the use of computers. However, as a result of this development, the machines are isolated into islands of automation, lacking a method and apparatus of complete automation. As machines process wafers in a factory, the processing varies from machine to machine as a result of slightly different machine characteristics. Further, as a machine ages, the characteristics of the machine vary such that the wafers which are processed by the machine are processed in a slightly different way resulting in process drift. Furthermore, as the environment around the machine changes slightly, the resulting process of the machine on the wafer changes resulting in additional process drift. As a result, if there was any process drift due to the above-described reasons, an engineer or factory personnel would be required to run a series of experiments on a particular machine to determine the reasons for the drift and to obtain a satisfactory compensation for the drift so that the process again reaches a target value. Since as described before, the factory consists of a large number of these machines, the job of the engineer is multiplied by a factor of 100 to maintain the complete factory to a predetermined target value.

OBJECTS OF THE INVENTION

It is an object of the invention to provide a control system that allows the engineer to determine the form or type of control for a specific process.

It is an additional object of the invention to provide different degrees of control, including model-based control, statistical process control, and diagnostic control. It is a further object of the invention to provide a controller that is compatible with different modeling techniques, modeling optimization techniques, different data acquisition techniques, different forms of data analysis, and different adjustment and feedback mechanisms.

It is a further object of the invention to define processes in terms of their desired effects and employ processes models that transform these effects into machine settings. It is a further object of the invention to provide for complete, seamless control, including the integration of material processing information, resource processing information, and process model feedback calculations. It is a further object of the present invention to provide a control mechanism such that the user defines how data is to be transformed, analyzed, and used to adjust process models.

SUMMARY OF THE INVENTION

The present invention provides a run-by-run supervisory process control system, allowing the user to adjust the form of control for a specific process.

The present invention additionally provides different degrees of control including model-based control, statistical process control, and diagnosis control.

The present invention is compatible with different techniques for model optimization, data acquisition and analysis, and model adjustment and feedback.

The present invention defines processes in terms of effects and uses process models that transform these effects into specific machine settings.

The present invention provides complete control and feedback that is seamless throughout the factory and across many varying pieces of machinery.

The present invention provides a feedback mechanism for a process model.

The present invention includes an apparatus for controlling a factory, comprising: circuitry for configuring a plurality of process models; circuitry for configuring a plurality control strategies; circuitry for selecting a process model from the process models and for selecting a control strategy from the control strategies; circuitry for calculating settings for the machine from the process model and the control strategy; circuitry for performing a process in accordance with the settings; circuitry for analyzing the process to determine if the process is within predetermined limits; and circuitry for determining if the process model in accordance with the analysis.

The present invention additionally includes circuitry for configuring measurements from the machine.

The present invention further includes circuitry for configuring strategy outputs to define how to apply a machine to the process.

The present invention further includes circuitry for defining a conbination of predictions or observations.

The present invention further includes circuitry for configuring a model tuner to tune the process model.

The present invention further includes circuitry for configuring an optimization strategy to solve the process model.

The present invention further includes circuitry to obtain the measurements.

The present invention further includes circuitry for applying the measurements to the process.

The present invention further includes circuitry for tuning the process model in accordance with the model tuner.

The present invention includes a method for controlling a factory comprising the steps of configuring a plurality of process models; configuring a plurality of control strategies; selecting a process model from the process models and selecting a control strategy from the control strategies; calculating settings for the machine from the process model and the control strategy; performing a process in accordance with the settings; analyzing the process to determine if the process is within predetermined limits; and tuning the process model in accordance with results of the analysis.

The present invention further includes the step of configuring measurements from the machine.

The present invention further includes the step of configuring strategy outputs to define how to apply matrix to the process.

The present invention further includes the method step of defining a combination of predictions or observations.

The present invention further includes the method step of configuring a model tuner to tune the method process.

The present invention further includes the step of configuring an optimization strategy so that the process model can be solved.

The present invention further includes the step of obtaining the measurements from the machine.

The present invention further includes the method step of applying the measurements to the process.

The present invention further includes the step of tuning the process model in accordance with the model tuner.

The present invention includes an apparatus for controlling a factory, comprising: circuitry for configuring a plurality of process models for different machines; circuitry for configuring a plurality of different control strategies for different machines; circuitry for selecting a process model for one machine of said machines from the process models and for selecting a particular control strategy for a particular machine from the control strategies; circuitry for calculating settings for the one machine from the the process model and the control strategy; circuitry for performing a process in accordance with the settings; circuitry for analyzing the process to determine if the process is within the predetermined limits; and circuitry for tuning the process model in accordance with the analysis.

These and other features of the invention that will be apparent to those skilled in the art from the following detailed description of the invention, taken together with the accompanying drawings.

BRIEF DESCRIPTION OF THE DRAWINGS

FIG. 1 illustrates a block diagram of the present invention.

FIG. 3 illustrates additional flow steps of the present invention.

FIG. 4 illustrates further flow steps of the present invention.

DETAILED DESCRIPTION OF THE INVENTION

In order to develop equations to model a specific process, the user, for example a control engineer, performs experiments on a machine (102). From the result of those experiments, the user develops a series of equations which predict the process behavior for that particular machine (102) which would be input to a ROM, RAM or memory of a computer.

Referring to FIG. 1, the predictive process model circuit(108) outputs a series of model outputs which correspond to a plurality of equations that describe the process behavior.

$Y1 = F1(x1, x2, x3 \ldots xn, c1, c2 \ldots cn)$ $Y2 = F2(x1, x2, x3 \ldots xn, c1, c2 \ldots cn)$ $Yn = Fn(x1, x2, x3 \ldots xn, c1, c2 \ldots cn)$ The equations are represented by model outputs Y1, Y2, . . . Yn which are defined in terms of model controllables x1, x2 . . . xn and constant values c1, c2 . . . cn. Instead of, for example, numbers, the constant values could be variables that are not resolved by the controller until runtime when the machine (102) is actually operating. However, the use of variables and constants allows for the configuration or the setting up of relationships that are to be used at a later time and preparation of the process model before runtime. Instead of immediately solving the values, the process model will have a description of how to resolve those values at runtime.

Figure 6:
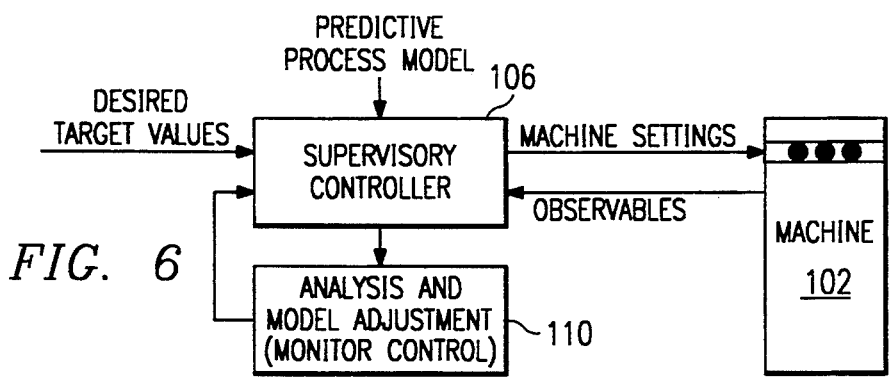
FIG. 6 illustrates a portion of FIG. 1.
Figure 7:
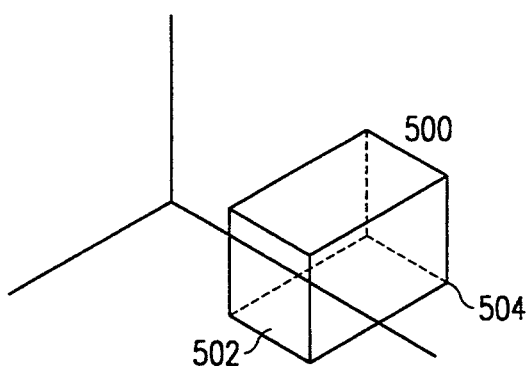
FIG. 7 illustrates a perspective view of a design space.

The model outputs from the predictive process model circuit (108) are input to the supervisory controller circuit (106), which provides targets for the setting of the machine (102), which are output to the regulator control circuit(104). The regulator control circuit (104) receives the targets from the supervisory control circuit (106) and determines the adjustment to the machine setting required to achieve the target setting, and sends this adjustment to machine (102). The machine (102) transmits an output signal, for example, through sensors (not shown) positioned on the machine to the monitor regulatory control circuit (112) as illustrated in FIG. 1 and FIG. 6 and the supervisory control circuit (106). The monitor regulatory control circuit (112) determines the difference between the output of the machine (102) and predetermined limits. A control signal is output from the monitor regulatory control circuit (112) corresponding to the difference and is input to the regulatory control circuit (104). In response to the control signal output from the monitor regulatory control circuit (112), the regulatory control circuit (104) adjusts the actual setting for the machine (102). The supervisory controller circuit (106) adjusts the output of the predictive process model circuit (108) in accordance with the output obtained from the machine (102). When the supervisory controller circuit (106) makes an adjustment, the supervisory control circuit outputs a signal to the monitor control system circuit (110). The monitor control system circuit (110) transmits a signal to the supervisory controller circuit (106) to indicate if the adjustment is correct, with respect to tuning limits.

Since a factory has many different processes to perform, the factory includes many different kinds of machines to perform those different processes. As a result of those different machines, different process models which could be stored in a library of process models are required to model the different machines. A user, after conducting various wafer tests that have been produced, analyzes the results of those wafer tests, for example, from a regression analysis, and develops equations that model the process behavior. Such an equation can be represented by $Yi=F(x1, x2 \ldots xn, c1, c2, \ldots cn)$ where Yi=model output and xi=model controllables and ci=constant values. This procedure can be repeated for all or different kinds of machines within the factory, and different kinds of model outputs (Yi) are obtained for each different kind of machine. These different kinds of process models are input to the predictive process model circuit (108) from a computer, a microcomputer, or a minicomputer via a work station, for example a personal computer which could operate on a distributed network.

Figure 5:
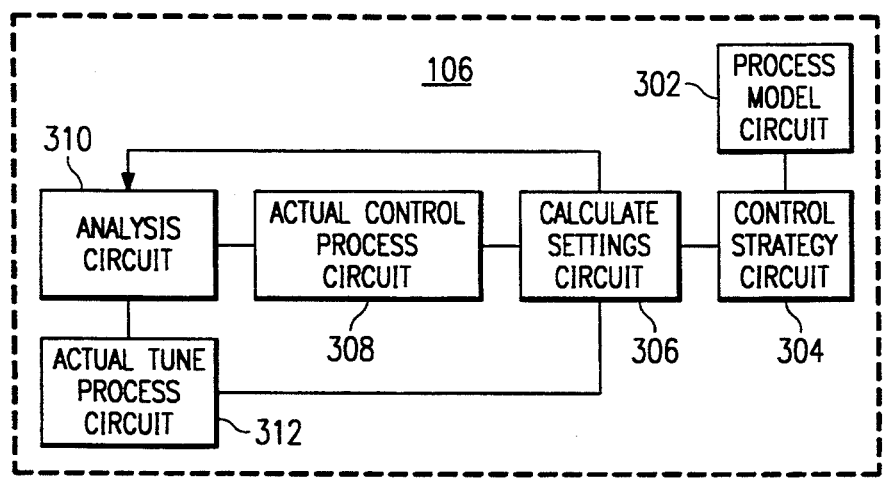
FIG. 5 illustrates a circuit diagram of the present invention.

Referring to FIG. 5, the process model circuit (302) includes a process model of the process behavior represented by equations as discussed above. A user, for example, a control engineer, configures the process model for the machine (102) for example, on the computer. There are three components to the process model circuit (302) the user must configure.

The first component, the model outputs describes the equations, for example, $Yi=F(xi,ci)$ as described above. The second component, the feedforward value defines how to obtain a value from the external environment, for example, for use in the equation of the output model and the prior material processing history of the wafer which has been processed by previous machines. When the process model is configured, the feedforward value is a variable in the model output equations. At runtime, which is after the time of configuration, the feedforward value is resolved in accordance with this definition, then the feedforward value replaces a variable with a constant in the model output equation. The last, or third component, the model controllables, which are machine parameters, are used to define limits on the allowed values for those same machine parameter values.

The process model circuit (302) transmits the process model to the control strategy circuit (304). The control strategy is data that defines how the supervisory controller circuit (106) and the monitor control system circuit (110) behave. The control strategy circuit (304) configures a control strategy to be used in combination with a process model to control the process. A user, for example, a control engineer configures the control strategy via a computer interface.

Instead of operating the machine by changing the machine settings of the machine, the information in the control strategy allows the user to specify the desired target values. The control strategy is used by the supervisory controller circuit to automatically control the machine (102) by adjusting the setting if the actual setting differs from the predicted setting. The control strategy provides a seamless control cycle significantly reducing if not eliminating the user intervention in the control cycle to control the process.

The control strategy circuit (304) configures a data sampling plan, which the controller uses to define the raw data to collect from sensors of the machine (102). A measurement calculator is created by the control strategy circuit (304) to define or a specification of how to transform the raw data, for example, from the sensors into measurements, for example, a time series analysis of the raw data could be generated by the data sampling plan, and a measurement calculator generates rate measurements for the time series analysis. The control strategy circuit (303) generates strategy outputs as a portion of the control strategy in order to solve the process model.

The strategy outputs include prediction equations to define the expected value of the strategy output, observation equations to define how to derive the actual value of the strategy output and is a function of the measurements, constraint values, and target values. The observation equation defines a function of measurements produced by a measurement calculator. The prediction equation defines a function of model outputs, for example, Yn. The constraint values are limits on the prediction values, for example, the constraint values define a maximum and a minimum value for the prediction equations. The target values are a specific desired value for each of the prediction equations, for example, the number 5. Both the prediction equations and the observation equations or just one of the prediction equations may be generated by the control strategy circuit (304).

Another aspect of configuring the control strategy by the control strategy circuit (304) is a transformation for defining the combination of predicted values or observed values to be used to judge the quality of the result of the process (102). The transformation which could be used during data analysis could define a test to be used on the predicted value, the observed value, or a combination of these values to determine if the process is within a predetermined control criteria. For example, one such test is the Western Electric rules for detecting trends in data. The test compares the data transform, for example, how to produce a value, for example, observed minus predicted.

A further aspect in configuring a control strategy by the control strategy circuit (304) is the configuration of model tuning. After the machine has completed the process, the observed values of the process are measured against the predicted values and adjustments to the process model may be required to improve subsequent processing. For example, the configuration of the model tuning determines which of the process model outputs to tune, for example, which equation, when to tune the model output or how often should the model output be tuned, for example, should the model be tuned after each wafer run. Lastly, the configuration specifies the minimum and maximum amount of tuning that is allowed. As a result of the configuration, the model tuner specifies and stores a description of how to tune so that at runtime the remaining information necessary for the tuning is supplied to the actual tune process circuit (312) and tuning can be completed.

The control strategy circuit (304) can provide four kinds of inputs to the control strategy. These inputs are configured by the user. First, a strategy controllable defines additional limits on a corresponding model controllable to further limit the model controllables. These additional limits limit the calculated settings for the machine which are obtained at runtime. Second, a feedforward value defines a variable to be resolved at runtime and is used as a constant in the equations. Third, a control parameter defines a machine setting input by the user when configuring the control strategy and requires no further evaluation. Fourth, a derived controllable represents a machine setting whose values is determined after the equations have been solved. The derived controllable includes an equation whose variables include other inputs.

Additionally, the control strategy circuit (307) configures an optimization strategy that defines how to solve the process model to obtain machine settings and predicted values for a process. The optimization strategy defines how to solve the equations for the model outputs and the strategy output predictions. In order to solve the equations, the optimization strategy must be configured so that the controller is able to obtain a single solution from the plurality of solutions. For example, if the design space is N-dimensional, the solution of the N-dimensional equations could include a series or number of solutions, each of the solutions representing either a best solution or a less than optimal but acceptable solution. The equations are solved by an optimization function such that either the closest solution to the starting point, a global best solution, or the first acceptable solution obtained from the starting point is returned. The optimization function is selected to match or be in accordance with the selected process model.

The determination of whether the equations can be solved or not, depends in some cases upon the starting point that is selected for the equations. By providing a series or number of starting points, the probability that the selected optimizer function will fail to solve the equations is dramatically reduced.

The operation of the control strategy circuit (304) has been described in a specific sequence, however the configuration could be performed in any sequence which the user, for example, the control engineer, determines is optimal for a particular application. A control strategy library includes control strategies for different machines. In order to configure a control system, a minimum amount of information needs to be configured, and before the controller permits the transfer from the configuration state to the run state, these minimum requirements must be satisfied. It is within the scope of the present invention to provide a test to determine if this minimum requirement has been satisfied.

Thus, the calculate setting circuit (306) concludes the configuration aspect of the control strategy; the remaining circuits, named the actual control process circuit (308), the analysis circuit (310), and the actual tuning process circuit (312) relate to runtime.

The process model circuit (302) and the control strategy circuit (304) have been separately defined such that the process model circuit (302) describes the output behavior of the process as a function of the model controllables, feedforward values, and other model outputs. The process model through the model outputs, Yi, limit the model controllables such that the model outputs define a design space (500) such that the predicted behavior of the process of the machine is in well defined bounds (502, 504), and any point within the design space (500) represents an acceptable solution to the process model. While the design space (500) has been illustrated in 3 dimensions, it is within the scope of the present invention that the design space (500) could be n-dimensional. The process model allows the controller to predict the ideal process behavior of the machine (102). The process model is a prediction for the ideal process and does not necessarily define the actual process behavior.

This prediction of the process allows the controller to compare the actual observed process behavior with the predicted behavior of the process model. When the process behavior does not match the predicted behavior, the process model is adjusted by a "feedback" so that future predicted process behavior corresponds more closely to the actual process behavior. The separation of the process model from the control strategy permits the control strategy to be flexible and to be quickly updated and relate to a wide range of machines performing similiar kinds of processes. The control strategy is configured in accordance with the user's needs, for example different kinds of machines. Thus, a control strategy must correspond to a particular process to predict process behavior of that process through predictions, record these predictions, and analyze the results of actual process behavior with respect to the predicted behavior in order to control the process.

In order to provide an accurate prediction, there are various methodologies used for defining process models. One example of these various methodologies for creating process models is fundamental modeling in which a fundamental physical model is represented by a series of differential equations which are solved. The fundamental physical model is a predefined model which might be generic for the process to be modeled.

Another of the various methodologies for creating the process models is response surface modeling in which the user, for example, a control engineer, performs a series of experimental processes in which the inputs and outputs of the experiment are modeled to produce a series of equations that predict the processes represented by the experiments.

A further methodology for creating the process models includes neural net modeling in which the user obtains predetermined input values and corresponding measured output values and "learns" a series of equations which relate or map the input values to the output values. The number of runs required to create the process model is generally greater than with the response surface modeling technique.

A further methodology for creating the process models is fuzzy modeling. This type of modeling is used in situations where the exact relationships between the input values and the output values are not specifically defined or quantified. The fuzzy modeling may include logic rules, such as if . . . then . . . , found in the control strategy. As an alternative, the user may choose an equation since it appears to provide the best approximation of the relationship between the input values and the output values.

A further methodology for creating process models is linear modeling where the relationship between the process input values and process output values are based on linear equations.

All of these methodologies are represented in a mathematical form of an equation which is solvable by a computer. In accordance with the present invention, the specific form of process models is configurable by the user and is easily interchangeable allowing an extremely flexible controller.

Before runtime of the controller (106), the control strategy is configured to provide a flexible outline of the relationship between the data of the control strategy. At runtime, this outline is replaced with actual data from, for example, the machine or the wafer history so that the process model can be solved.

One way that the analysis circuit (310) interprets the results of the process is through the "data sampling plan". The data sampling plan specifies the information or raw data from the sensors on the machine which are required to analyze the process. Thus, the data sampling plan defines the specific data items which the machine (102) supplies to the controller so that the controller can evaluate the results from the machine. For example, if the process to be performed relates to a machine that etches a layer from a wafer, the machine could use a sensor on the machine such as an ellipsometer to measure the thickness of the wafer during the etch process and to stop the process after the thickness has reached a predetermined thickness value. The data sampling plan requests the machine to supply thickness information and time information from the ellipsometer during the etch process. Once the data sampling plan receives the actual thickness and time information, the measurement calculator calculates the etch rate which of course is a function of thickness and time information and supplies the etch rate to the controller (106).

Another example of the data sampling plan, if the process of the machine is to deposit a layer of metal on the surface of the wafer, the machine deposits metal for a period of time to produce the required thickness of the metal. The controller (106) requires the metal thickness deposited by the machine as a result of the process performed by the machine. However, the machine does not directly measure thickness; instead, the machine measures the resistivity of the surface of the deposited metal layer, which is used to derive the thickness. The data sampling plan specifies that the machine supply the resistivity as measured by the equipment and a measurement calculator calculates the thickness from the resistivity supplied to the controller.

In order to provide a flexible data sampling plan, one way to achieve the above mentioned results is to employ object oriented design to model the various circuits for deriving measurement values. A specific class is associated with different techniques for deriving measurement values such that the class includes the specific software to extract the specific information from the data sampling plan and to convert that information into the specific information required by the controller. In the above example, classes defined using object-oriented design provide the software to retrieve the thickness from the ellipsometer and to retrieve the period of time to produce the required thickness so that an etch rate can be calculated. With respect to the second above example, the classes defined using object oriented- design include the software to retrieve the resistivity data from the deposition machine and to convert this data into a thickness value required by the controller.

When the user, for example a control engineer, completes the configuration of the process model circuit (302) and the control strategy circuit (304), this data is transmitted to the calculate settings circuit (306). The calculate settings circuit (306) uses the configured data to determine the values of the machine parameters, which are then sent to the machine as settings. The calculate settings circuit (306) employs the equation solving algorithm specified in the control strategy to solve the equations. The values of the solved equations are the basis of the machine settings that are sent to the actual process circuit (308), and the predicted values that are sent to the analysis circuit (310).

The actual control process circuit (308) defines the particular process step for a particular machine, for example, by an index value selected by the user. In accordance with this index value, a selection is made of a now predefined process model and a now predefined control strategy. The actual control process circuit (308) supplies the model outputs of the selected process model in terms of model constraints, objective functions, the predicted and observable values, the constraint and target values, the limits of the model controllable and the other parameters associated with the optimization strategy. The actual control process circuit fills the data sampling plan during processing and supplies the analysis circuit (310) with actual data from the sensors of the machine to return the data defined by the configuration of the control strategy circuit (304). The actual control process circuit (308) controls the machine to perform the process in accordance with settings produced by the control strategy and target values supplied from the process step and control strategy. The measurement calculator in the analysis circuit (310) obtains the measurements and derives the observed values from the measurements once processing has completed. The analysis circuit (310) transforms the actual data from the machine as configured by the control strategy circuit (304) and performs the configured tests by using the transformed data in accordance with the configured tests. The actual tuning process circuit (312) uses the tuner configured in the control strategy circuit (304) to tune the model output equations from the process model equations by obtaining a delta by composing the observed values of actual process with the predicted values from the process model. If the delta is not within predetermined limits, future processing stops. If the delta is within the predetermined limits, the active tuning process circuit (312) activates the calculating setting circuit (306) to prepare the machine for another process, for example, another wafer to be processed.

Figure 2:
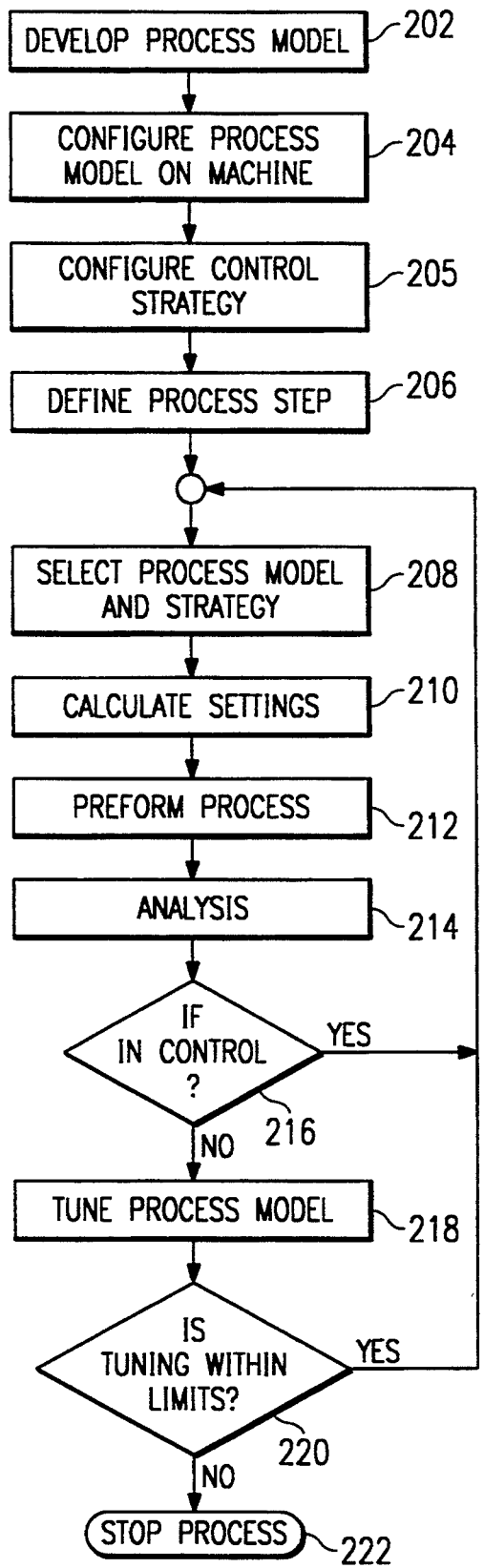
FIG. 2 illustrates a flow diagram of the present invention.

The operation of the controller (106) is illustrated in FIG. 2. At step 202, the process model is developed by entering the results of wafer tests by a user, for example, a control engineer. At Step 202 output equations are provided that model process behavior, for example, $Y_i = F(X_1, x_2, \ldots x_n, c_1, c_2, \ldots c_n)$ where $Y_i$=model output and $x_i$=the model controllable and $c_i$=constant value. At Step 204, the process model is configured for a machine by a user. For example, the user constructs equations and defines feedforward values, and model controllable in accordance with a particular machine. The selected output equations define a design space (500) which may be multi-dimensional. At Step 205, the control strategy is configured. Step 205 includes three such steps, namely Step 230, Step 232, and Step 234. Steps 230, 232, and 234 are illustrated in FIG. 4. Additionally, as illustrated in FIG. 3, the substeps of Step 230 are illustrated. At Step 206, the measurements are configured, for example, the data sampling plan for obtaining raw data from sensors associated with the machine are obtained. A measurement calculator is configured and generated to define how to transform the raw data from the sensors to measurements, for example, from an equation.

At Step 238, the prediction equations, targets, constraints and observation equations are defined as strategy outputs. For example, the observation equation defines a function of the measurements to produce the observed value. The prediction equation defines a function of model outputs to produce the predicted value. The constraint values are limits on the predicted values, and the target values are specific targets for predicted values.

At Step 240, the transformation and analysis is configured to define the combination of predicted values or observed values to be analyzed and to define the data analysis, for example, what tests are to be used in analyzing the data after the process has been completed with the selected machine in order to determine if the process is behaving as predicted.

At Step 242, model tuning is configured to specify which model output equation is adjusted, when or how often to receive the observed value or predicted values, how or which tuning algorithm to use to achieve, for example, minimum tuning or maximum tuning.

Referring to FIG. 4, at Step 232, the inputs are configured to define limits on the strategy outputs, to set the value of additional machine parameters. Additionally, definition of strategy controllables that further constrain the model controllables, feedforward values, with their limits are configured.

Further, at Step 234, the optimization strategy is configured to define how to solve the equations, model outputs and strategy outputs. For example, how to select the best solution using either the closest solution to the prior, the global best solution, or the first solution. Additionally, the optimization strategy is configured to select the objective function which evaluates the equations for a solution that is optimal.

Referring to FIG. 2 at Step 206, the process step is defined in accordance with the machine that the user has selected. At Step 208, a process model and a control strategy is selected by the software in accordance with the process step. At Step 210, the actual controllable or machine settings are selected by the controller (320) in accordance with the process model and control strategy. At Step 212, the controller (320) directs the machine to perform the process step, for example, process a wafer in accordance with the settings which have been calculated. At Step 214, the analysis is performed by applying the measurement calculator which has previously been configured to obtain observed values for the measurements. The data is transformed as specified and the tests which have been configured previously are executed, using the transformed data. At Step 216, a determination is made if the machine is within control parameters limits by evaluating the test results of the analysis. If the machine is in control, the control is transferred between Steps 206 and Step 208. If the machine is not in control, the process model is tuned in accordance with the analysis to obtain adjusted model output equations. However, at Step 220, a determination is made if the tuning is within predetermined tuning limits. If the tuning is not within the predetermined tuning limits, then the process is stopped at Step 222 so that the machine can be reevaluated. If the tuning is within the predetermined tuning limits, then control is transferred between Steps 206 and 208.

Although, the present invention has been described in terms of a semiconductor factory, the present invention could be applied equally to other types of factories.

Figure 8:
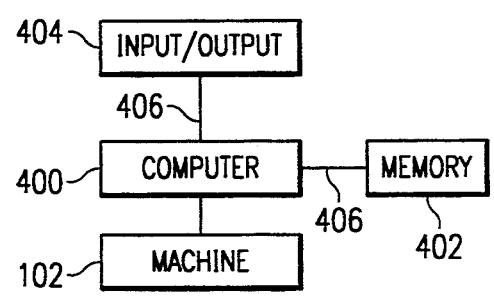
FIG. 8 illustrates a block diagram of the present invention.

Referring to FIG. 8, a computer 400 is coupled to a memory 402, and an input/output device 404 through bus 406 could be employed to implement the present invention.

We claim:

1. An apparatus for controlling a factory, comprising:
   circuitry for configuring a plurality of process models;
   circuitry for configuring a plurality control strategies;
   circuitry for selecting a process model from said process models and for selecting a control strategy from said control strategies;
   circuitry for calculating settings for a machine from said selected process model and said selected control strategy;
   circuitry for performing a process in accordance with said settings;
   circuitry for analyzing said process to determine if said process is within predetermined limits; and
   circuitry for tuning said process selected model in accordance with said analysis.

2. An apparatus for controlling a factory as in claim 1, wherein said circuitry for configuring said control strategies include circuitry for configuring measurements from said machine.

3. An apparatus for controlling a factory as in claim 1, wherein said circuitry for configuring said control strategies includes circuitry for configuring strategy outputs to define how to apply measurements to said process.

4. An apparatus for controlling a factory as in claim 1, wherein said circuitry for configuring said process models further comprises circuitry for defining a combination of predictions or observations.

5. An apparatus for controlling a factory as in claim 1, wherein said circuitry for configuring said process models further comprises circuitry for configuring a model tuner to tune said process model.

6. An apparatus for controlling a factory as in claim 1, wherein said circuit for configuring said process models further comprises circuitry for configuring an optimization strategy to solve said process model.

7. An apparatus for controlling a factory as in claim 2, wherein said circuit for configuring measurements comprises circuitry to obtain said measurements.

8. An apparatus for controlling a factory as in claim 3, wherein said circuitry for configuring strategy comprises circuitry for applying said measurements to said process.

9. An apparatus for controlling a factory as in claim 5, wherein said circuit for configuring a model tuner comprises circuitry for tuning said process model in accordance with said model tuner.

10. A method for controlling a factory comprising the steps of:
   configuring a plurality of process models;
   configuring a plurality of control strategies;
   selecting a process model from said process models and selecting a control strategy from said control strategies;
   calculating settings for a machine from said selected process model and said selected control strategy;
   performing a process in accordance with the said settings;
   analyzing said process to determine if said process is within predetermined limits; and
   tuning said selected process model in accordance with result of said analyzing steps.

11. An apparatus for controlling a factory as in claim 10, wherein the step of configuring the control strategies further includes the step of configuring measurements from the machine.

12. The method for controlling a factory as in claim 10, wherein the step of configuring the control strategies includes the step of configuring strategy outputs to define how to apply measurements to said process.

13. A method for controlling a factory as in claim 10, wherein the step of configuring the control strategies includes the method step of defining a combination of predictions or observations.

14. A method for controlling a factory as in claim 10, wherein the step of configuring the control strategies includes the method step of configuring a model tuner to tune said process.

15. A method for controlling a factory as in claim 10, wherein the step of configuring the control strategies includes the step of configuring an optimization strategy to solve said process model.

16. A method for controlling a factory as in claim 11, wherein the step of configuring measurements includes the step of obtaining said measurements from machine.

17. A method for controlling a factory as in claim 12, wherein the step of configuring the strategy outputs includes the step of applying said measurements to said process.

18. A method for controlling a factory as in claim 14, wherein the step of configuring the model tuner includes the step of tuning the process model in accordance with said model tuner.

19. An apparatus for controlling a factory, comprising:
   circuitry for configuring a plurality of process models for different machines;
   circuitry for configuring a plurality of different control strategies for different machines;
   circuitry for selecting a process model for one machine of said different machines from said process models and for selecting a particular control strategy for said one machine from said control strategies;
   circuitry for calculating settings for said one machine from the said process model and said control strategy;
   circuitry for performing a process in accordance with said settings;
   circuitry for analyzing said process to determine if said process is within said predetermined limits; and
   circuitry for tuning said process model in accordance with said analysis.

* * * * *